(12) United States Patent
Omura et al.

(10) Patent No.: US 11,572,602 B2
(45) Date of Patent: Feb. 7, 2023

(54) METHOD FOR MANUFACTURING A GRAIN-ORIENTED ELECTRICAL STEEL SHEET

(71) Applicant: JFE STEEL CORPORATION, Tokyo (JP)

(72) Inventors: Takeshi Omura, Tokyo (JP); Hirotaka Inoue, Tokyo (JP); Seiji Okabe, Tokyo (JP)

(73) Assignee: JFE STEEL CORPORATION, Tokyo (JP)

( * ) Notice: Subject to any disclaimer, the term of this patent is extended or adjusted under 35 U.S.C. 154(b) by 0 days.

(21) Appl. No.: 17/349,912

(22) Filed: Jun. 17, 2021

(65) Prior Publication Data

US 2021/0310096 A1    Oct. 7, 2021

Related U.S. Application Data

(62) Division of application No. 15/547,677, filed as application No. PCT/JP2016/000622 on Feb. 5, 2016, now abandoned.

(30) Foreign Application Priority Data

Feb. 5, 2015  (JP) .................................. 2015-021513

(51) Int. Cl.
  *C21D 9/46*      (2006.01)
  *C22C 38/60*     (2006.01)
  (Continued)

(52) U.S. Cl.
  CPC ................. *C21D 9/46* (2013.01); *C21D 3/04* (2013.01); *C21D 6/004* (2013.01); *C21D 6/005* (2013.01);
  (Continued)

(58) Field of Classification Search
  CPC . C21D 9/46; C21D 3/04; C21D 6/004; C21D 6/005; C21D 6/008; C21D 8/005;
  (Continued)

(56) References Cited

U.S. PATENT DOCUMENTS 7,942,982 B2    5/2011  Kubo et al.
8,016,951 B2    9/2011  Arai et al.
(Continued)

FOREIGN PATENT DOCUMENTS

CN    103069038 A    4/2013
EP       2602340 A1    6/2013
(Continued)

OTHER PUBLICATIONS

"Current State and Trends in Noise Control Techniques for Stationary Equipment", IEEJ Technical Report, Dec. 1996, pp. 14, 15, 30 and 31, No. 616, The Institute of Electrical Engineers of Japan.
(Continued)

*Primary Examiner* — Humera N. Sheikh
*Assistant Examiner* — Kevin C T Li
(74) *Attorney, Agent, or Firm* — Kenja IP Law PC

(57) ABSTRACT

Provided is a method for manufacturing a grain-oriented electrical steel sheet. The method comprises: hot rolling a slab to obtain a hot rolled sheet; subjecting the hot rolled sheet to hot band annealing as necessary; subjecting the hot rolled sheet to cold rolling; subjecting the cold rolled sheet to decarburization annealing; applying an annealing separator having MgO as a main component onto a surface of the decarburization annealed sheet and subjecting the decarburization annealed sheet to final annealing to form the forsterite film; and applying an insulating coating treatment liquid onto the final annealed sheet and subjecting the final annealed sheet to flattening annealing to form a tension-applying insulating coating. A difference in total tensions
(Continued)

between one and opposite surfaces of the sheet is less than 0.5 MPa. A difference in tensions between the forsterite films in one and opposite surfaces of the sheet is 0.5 MPa or more.

4 Claims, 13 Drawing Sheets

(51) Int. Cl.

| | | |
|---|---|---|
| C21D 8/12 | (2006.01) | |
| C22C 38/00 | (2006.01) | |
| C22C 38/02 | (2006.01) | |
| C22C 38/44 | (2006.01) | |
| G01R 33/18 | (2006.01) | |
| H01F 1/18 | (2006.01) | |
| C23C 22/74 | (2006.01) | |
| G01H 9/00 | (2006.01) | |
| C22C 38/04 | (2006.01) | |
| C22C 38/06 | (2006.01) | |
| C22C 38/42 | (2006.01) | |
| C23C 22/38 | (2006.01) | |
| C21D 3/04 | (2006.01) | |
| C21D 6/00 | (2006.01) | |
| C21D 8/00 | (2006.01) | |
| C23C 22/08 | (2006.01) | |
| H01F 10/08 | (2006.01) | |
| H01F 27/33 | (2006.01) | |

(52) U.S. Cl.
CPC ............ *C21D 6/008* (2013.01); *C21D 8/005* (2013.01); *C21D 8/125* (2013.01); *C21D 8/1255* (2013.01); *C21D 8/1261* (2013.01); *C21D 8/1283* (2013.01); *C21D 8/1288* (2013.01); *C22C 38/00* (2013.01); *C22C 38/001* (2013.01); *C22C 38/002* (2013.01); *C22C 38/008* (2013.01); *C22C 38/02* (2013.01); *C22C 38/04* (2013.01); *C22C 38/06* (2013.01); *C22C 38/42* (2013.01); *C22C 38/44* (2013.01); *C22C 38/60* (2013.01); *C23C 22/08* (2013.01); *C23C 22/38* (2013.01); *C23C 22/74* (2013.01); *G01H 9/00* (2013.01); *G01R 33/18* (2013.01); *H01F 1/18* (2013.01); *H01F 10/08* (2013.01); *C21D 8/1222* (2013.01); *C21D 8/1233* (2013.01); *H01F 27/33* (2013.01)

(58) Field of Classification Search
CPC .... C21D 8/125; C21D 8/1255; C21D 8/1261; C21D 8/1283; C21D 8/1288; C21D 8/1222; C21D 8/1233; C21D 27/33; C21D 27/12; C22C 38/00; C22C 38/001; C22C 38/002; C22C 38/008; C22C 38/02; C22C 38/04; C22C 38/06; C22C 38/42; C22C 38/44; C22C 38/60; C22C 22/08; C22C 22/38; C22C 22/74; C22C 22/00; G01R 33/18; H01F 1/16; H01F 10/08; H01F 27/33; H01F 41/00; G01H 9/00
See application file for complete search history.

(56) References Cited

U.S. PATENT DOCUMENTS

| | | | |
|---|---|---|---|
| 8,535,455 B2 | 9/2013 | Takashima et al. | |
| 8,568,857 B2 | 10/2013 | Takashima et al. | |
| 2005/0112377 A1 | 5/2005 | Schuhmacher et al. | |
| 2009/0218015 A1 | 9/2009 | Fujita et al. | |
| 2011/0236581 A1* | 9/2011 | Muraki | C23C 26/00 106/286.6 |
| 2013/0129984 A1* | 5/2013 | Omura | H01F 41/00 148/120 |
| 2013/0129985 A1* | 5/2013 | Inoue | C22C 38/08 148/120 |
| 2013/0143004 A1 | 6/2013 | Takashima et al. | |

FOREIGN PATENT DOCUMENTS

| | | | |
|---|---|---|---|
| EP | 2602348 A1 | | 6/2013 |
| JP | 2001181803 A | | 7/2001 |
| JP | 2007002334 A | | 1/2007 |
| JP | 2009231477 A | | 10/2009 |
| JP | 2009235472 A | | 10/2009 |
| JP | 2009235473 A | * | 10/2009 |
| JP | 2009235473 A | | 10/2009 |
| JP | 2009236904 A | | 10/2009 |
| JP | 2012052231 A | | 3/2012 |
| JP | 2013068517 A | | 4/2013 |
| KR | 1020130020933 A | | 3/2013 |
| RU | 2358346 C1 | | 6/2009 |
| RU | 2405842 C1 | | 12/2010 |
| RU | 2431697 C1 | | 10/2011 |

OTHER PUBLICATIONS

Apr. 19, 2016, International Search Report issued in the International Patent Application No. PCT/JP2016/000622.
Dec. 5, 2017, the Extended European Search Report issued by the European Patent Office in the corresponding European Patent No. 16746335.5.
Jul. 11, 2018, Office Action issued by Federal Service for Intellectual Property, Patents and Trademarks of the Russian Federation in the corresponding Russian Patent Application No. 2017131098 with English language Search Report.
Jun. 19, 2018, Office Action issued by the State Intellectual Property Office in the corresponding Chinese Patent Application No. 201680008816.6 with English language Search Report.
May 25, 2021, Communication pursuant to Article 94(3) EPC issued by the European Patent Office in the corresponding European Patent Application No. 16746335.5.
Oct. 31, 2018, Office Action issued by the Korean Intellectual Property Office in the corresponding Korean Patent Application No. 10-2017-7022745 with English language concise statement of relevance.
Takaaki Yamamoto et al., "Magnetic Properties of Grain-Oriented Silicon Steel with High Permeability Orientcore HI-B", IEEE Transactions on Magnetics, Sep. 1972, pp. 677-681, vol. 8, Issue: 3.

\* cited by examiner

METHOD FOR MANUFACTURING A GRAIN-ORIENTED ELECTRICAL STEEL SHEET

CROSS-REFERENCE TO RELATED APPLICATIONS

This application is a divisional application of U.S. application Ser. No. 15/547,677 filed Jul. 31, 2017, which is a National Stage Application of PCT/JP2016/000622 filed Feb. 5, 2016, which claims priority to Japanese Patent Application No. 2015-021513 filed Feb. 5, 2015. The disclosures of the prior applications are hereby incorporated by reference herein in their entirety.

TECHNICAL FIELD

This disclosure relates to a grain-oriented electrical steel sheet used as an iron core material in a transformer or the like, a method for manufacturing this grain-oriented electrical steel sheet, and a method for predicting a transformer noise property. In particular, this disclosure relates to a grain-oriented electrical steel sheet having low transformer noise, a method for manufacturing this grain-oriented electrical steel sheet, and prediction of the noise property of a transformer in which this grain-oriented electrical steel sheet is used.

BACKGROUND

The iron core of a transformer is normally a grain-oriented electrical steel sheet laminate (laminate iron core) or a coiled grain-oriented electrical steel sheet (coil iron core). Examples of important properties that a transformer is required to demonstrate include excellent iron loss (no-load loss) and excitation current properties. Moreover, it has recently become important for a transformer to have an excellent noise property (i.e., low noise) in consideration of the surrounding environment where the transformer is installed and so forth.

Transformer noise is known to be largely dependent on the magnetostrictive properties of the electrical steel sheet used as the iron core. As disclosed in Non-Patent Literature (NPL) 1, it is thought that magnetostrictive properties of a grain-oriented electrical steel sheet are determined by the magnetic flux density $B_8$ (magnetic flux density at a magnetic field strength of 800 A/m) of the steel sheet, and magnetostriction (magnetostrictive amplitude) is known to decrease as $B_8$ increases. Non-Patent Literature 2 provides an example in which the noise level of an actual transformer is lowered through use of an electrical steel sheet having reduced magnetostrictive amplitude. In other words, a low-noise transformer is typically manufactured by using a grain-oriented electrical steel sheet having a small magnetostrictive amplitude as an iron core.

The reduction of magnetostriction (magnetostrictive amplitude $\lambda$) through means other than magnetic flux density has also been studied in PTL (Patent Literature) 1 to 3 and the like.

In relation to magnetostrictive properties other than the magnetostrictive amplitude that influence noise, PTL 4 focuses on the velocity waveform of magnetostrictive vibration and proposes that a parameter obtained through frequency analysis and frequency weighting of this velocity waveform, which in other words is a parameter focused on the higher-harmonic component of the velocity component of magnetostriction, is effective for transformer noise reduction.

CITATION LIST

Patent Literature

PTL 1: JP 2007-2334 A
PTL 2: JP 2009-231477 A
PTL 3: JP 2001-181803 A
PTL 4: JP 2009-236904 A

Non-Patent Literature

NPL 1: IEEE Transactions 8 (1972), p. 677
NPL 2: IEEJ Technical Report No. 616, "Current State and Trends in Noise Control Techniques for Stationary Equipment", The Institute of Electrical Engineers of Japan, 1996

SUMMARY

Technical Problem

When a number of transformers are manufactured using grain-oriented electrical steel sheets having high magnetic flux density $B_8$ or grain-oriented electrical steel sheets manufactured using the magnetostriction reduction techniques disclosed in PTL 1 to 3 and the like, the manufactured transformers, on the whole, have low noise values compared to when using grain-oriented electrical steel sheets having low $B_8$ or grain-oriented electrical steel sheets manufactured without using conventional magnetostriction reduction techniques such as those in PTL 1 to 3.

However, it is not necessarily always possible to achieve the intended effect due to large variation in the noise of these transformers and so forth.

Moreover, conventional techniques are not yet able to meet the transformer noise level demanded by societies that have become increasingly focused on the environment in recent years.

Furthermore, when magnetostrictive properties and transformer noise are managed through the parameter described in PTL 4, it is common for differences in transformer noise to arise even when this parameter has the same value. Therefore, this parameter is inadequate as a selection criteria for grain-oriented electrical steel sheets having low transformer noise.

In light of the current situation set forth above, it would be helpful to provide a grain-oriented electrical steel sheet having an even better noise property in an actual transformer and also to provide an advantageous method for manufacturing this grain-oriented electrical steel sheet.

Solution to Problem

In our investigation pertaining to grain-oriented electrical steel sheets capable of further noise reduction in actual transformers, we conducted studies to discover why transformer noise cannot be adequately explained by conventional magnetostrictive property parameters. Through these studies, we discovered that besides the magnetic flux density $B_8$ and the higher-harmonic component included in the velocity component of magnetostrictive vibration, which are conventionally known factors relating to a grain-oriented electrical steel sheet that influence the noise property of a transformer, velocity change (frequency and degree of acceleration/deceleration) of magnetostrictive vibration has at least as significant an influence on transformer noise as conventionally known parameters.

Specifically, we discovered that greater transformer noise reduction than with conventional techniques can be achieved when the following conditions are placed on the velocity change behavior of magnetostrictive vibration.

1) The number of acceleration/deceleration points that are present in a magnetostriction velocity level $d\lambda/dt$ in one period of magnetostrictive vibration is 4.

2) Velocity level change in an acceleration zone or deceleration zone of magnetostrictive vibration, in terms of the difference between adjacent local maximum and minimum values, is $3.0 \times 10^{-4}$ $sec^{-1}$ or less.

We also discovered that controlling the tension of a forsterite film and a tension coating is an effective way of ensuring that the velocity change behavior of magnetostrictive vibration meets the conditions set forth above.

Specifically, the tension is set such that:

1) a front/rear difference in total tension of the forsterite film and the insulating coating is less than 0.5 MPa; and 2) a front/rear difference in tension of the forsterite film is 0.5 MPa or more.

Film tension is controlled by the following methods.

1) Means of adjusting tension of the forsterite film include changing at least one of: formation conditions of an internal oxidation layer at front and rear steel sheet surfaces in decarburization annealing; the type of annealing separator; the application amount of annealing separator; and the amount of electrodeposition in electrodeposition treatment performed before final annealing.

2) Means of adjusting tension of the insulating coating include changing the thickness and/or composition of the insulating coating.

Experimental results that led to these findings are described below.

<Experiment 1>

First, we investigated the relationship between acceleration/deceleration points and transformer noise. In an initial study, we superimposed a higher-harmonic on an excitation voltage to change magnetostrictive properties. A 300 kVA actual transformer was assembled using a 0.27 mm grain-oriented electrical steel sheet and was evaluated for noise at 50 Hz and 1.7 T. FIG. 1 illustrates an example of a magnetostrictive vibration velocity level. We considered that vibration with repeated acceleration and deceleration may be a major cause of increased noise, and thus investigated the relationship between noise and the number of acceleration/deceleration points in one period of magnetostrictive vibration. Since evaluation was performed at a frequency of 50 Hz, one period was equivalent to an interval of 0.02 sec. Eight acceleration/deceleration points are observed in the case illustrated in FIG. 1. However, in the case of magnetostrictive vibration that is an ideal sinusoidal wave, the number of acceleration/deceleration points ($d\lambda/dt=0$) is 4, and thus the minimum number of acceleration/deceleration points is 4.

FIG. 2 illustrates a relationship between the number of acceleration/deceleration points and actual transformer noise. This indicates a trend of increasing noise with increasing number of points, demonstrating that it is necessary for the number of acceleration/deceleration points to be limited to the minimum number of 4.

Next, we investigated the influence of velocity change in an acceleration zone or deceleration zone of magnetostrictive vibration. The difference between adjacent local maximum and minimum values was investigated as a parameter for evaluating the velocity change (refer to FIG. 3). This parameter focuses on velocity change within an acceleration/deceleration zone and does not include velocity change spanning across both acceleration and deceleration zones.

As illustrated in FIG. 3, a number of local maximum values and local minimum values are present in one period of a magnetostriction waveform.

FIG. 4 illustrates the results of an investigation into the relationship between actual transformer noise and the maximum value of differences in magnetostriction velocity level between adjacent local maximum and minimum values (magnitude of velocity level change). It can be seen from FIG. 4 that a good actual transformer noise property is achieved when the magnitude of velocity level change has a maximum value of $3.0 \times 10^{-4}$ $sec^{-1}$ or less.

After investigating the relationship between noise and the maximum value of the magnitude of velocity level change in the experiment described above, we further investigated the relationship between the number of velocity level change points and the noise value in a situation in which a higher-harmonic was superimposed on an excitation voltage to vary the number of velocity level change points while keeping the maximum value of the magnitude of velocity level change roughly the same at $3.0 \times 10^{-4}$ $sec^{-1}$. Velocity level change points occurring at positions indicated by stars in FIG. 3 are points at which:

1) an increasing rate of acceleration changes to a decreasing rate of acceleration;

2) a decreasing rate of acceleration changes to an increasing rate of acceleration;

3) an increasing rate of deceleration changes to a decreasing rate of deceleration; or 4) a decreasing rate of deceleration changes to an increasing rate of deceleration.

FIG. 5 illustrates the results of evaluation of the relationship between the number of velocity level change points and the noise value that were obtained through our investigation. These results demonstrate that when the magnitude of velocity level change has a maximum value of approximately $3.0 \times 10^{-4}$ $sec^{-1}$, instances of velocity change that are smaller than the maximum value do not have a significant influence on the noise property.

Based on these results, we determined that to enhance the noise property of an actual transformer, it is important that:

5) the number of acceleration/deceleration points that are present in the magnetostriction velocity level $d\lambda/dt$ in one period of magnetostrictive vibration is 4; and 6) the magnitude of velocity level change between adjacent velocity level change points in an acceleration zone or deceleration zone of magnetostrictive vibration is $3.0 \times 10^{-4}$ $sec^{-1}$ or less.

Furthermore, we reached a new finding that it is important to reduce the largest magnitude of velocity level change when investigating means for enhancing magnetostrictive properties. This is because among magnitudes of velocity level change between adjacent velocity level change points, an increase in the number of small magnitudes of velocity level change only has a very small influence on the noise property, whereas the largest magnitude of velocity level change has a very large influence.

<Experiment 2>

Next, we conducted studies in relation to specific methods for controlling magnetostrictive properties.

Since magnetostrictive properties are generally known to change depending on film tension, we initially investigated the influence of film tension on magnetostrictive properties.

A surface at one side of a decarburization annealed sheet of 0.23 mm in thickness manufactured by a commonly known method was subjected to electrodeposition of Cu in a range of 0 mg/m² to 3 mg/m². An annealing separator containing 5 parts by mass of $TiO_2$ per 100 parts by mass of MgO was then applied onto front and rear surfaces of the sheet in an amount of 7 g/m² on each surface and was dried. Thereafter, the sheet was subjected to final annealing for 5 hours at 1220° C. with a heating rate of 10° C./hour. Unreacted annealing separator was subsequently removed. An insulating coating containing 60% colloidal silica and aluminum phosphate was then applied onto the front and rear surfaces in an amount of 5.0 g/m² to 9.0 g/m² on each surface and was baked at 850° C.

Magnetostrictive vibration can be measured by a strain gauge method, or using a laser displacement meter or a laser Doppler vibrometer. Herein, evaluation of magnetostrictive vibration properties was performed using a laser Doppler vibrometer due to the simplicity thereof.

Table 1 shows the amount of Cu electrodeposition, the insulating coating application amount, the front/rear difference in forsterite film tension, the front/rear difference in insulating coating tension, the number of acceleration/deceleration points in one period of magnetostrictive vibration, and the magnitude of velocity level change between adjacent velocity level change points in an acceleration zone or deceleration zone of magnetostrictive vibration.

orthogonal to the rolling direction by 30 mm in the rolling direction, removing the tension coating from one surface thereof, measuring the magnitude of deflection of the steel sheet before and after this removal, and then converting these magnitudes of deflection to a tension according to the following conversion formula.

$$\text{Conversion formula } \sigma = \frac{Ed}{l^2}(a_2 - a_1)$$

$\sigma$: Film tension(MPa)
$E$: Young's modulus of steel sheet = 143(GPa)
$l$: Deflection measurement length(mm)
$a_1$: Magnitude of deflection before removal(mm)
$a_2$: Magnitude of deflection after removal(mm)
$d$: Steel sheet thickness(mm)

The insulating coating tension at the other surface was determined by the same method using a separate sample taken from the same product. The rolling direction tension of the forsterite film was calculated by cutting out a sample of 280 mm in a direction orthogonal to the rolling direction by 30 mm in the rolling direction, removing the insulating coating from both surfaces thereof, measuring the magnitude of deflection of the steel sheet, subsequently removing

TABLE 1

| No. | Cu electrodeposition amount (g/m²) Front surface | Cu electrodeposition amount (g/m²) Rear surface | Insulating coating application amount (g/m²) Front surface | Insulating coating application amount (g/m²) Rear surface | Forsterite film tension difference (MPa) | Insulating coating tension difference (MPa) | Magnetostrictive properties Acceleration/ deceleration points *1 | Magnetostrictive properties Magnitude of velocity level change (sec⁻¹) *2 |
|---|---|---|---|---|---|---|---|---|
| 1 | 0 | 0 | 5 | 5 | 0 | 0 | 8 | $7.6 \times 10^{-4}$ |
| 2 | 0 | 0.5 | 5 | 5 | 0.4 | 0 | 6 | $4.6 \times 10^{-4}$ |
| 3 | 0 | 1 | 5 | 5 | 0.6 | 0 | 4 | $1.2 \times 10^{-4}$ |
| 4 | 0 | 1.5 | 5 | 5 | 1.0 | 0 | 4 | $0.8 \times 10^{-4}$ |
| 5 | 0 | 2 | 5 | 5 | 1.2 | 0 | 4 | $0.6 \times 10^{-4}$ |
| 6 | 0 | 2.5 | 5 | 5 | 1.6 | 0 | 4 | $0.8 \times 10^{-4}$ |
| 7 | 0 | 3 | 5 | 5 | 2.0 | 0 | 4 | $0.6 \times 10^{-4}$ |
| 8 | 0 | 0 | 6 | 5 | 0 | 0.1 | 8 | $7.8 \times 10^{-4}$ |
| 9 | 0 | 0 | 6.5 | 5 | 0 | 0.4 | 6 | $6.0 \times 10^{-4}$ |
| 10 | 0 | 0 | 7 | 5 | 0 | 0.6 | 4 | $4.5 \times 10^{-4}$ |
| 11 | 0 | 0 | 7.5 | 5 | 0 | 1.0 | 4 | $4.5 \times 10^{-4}$ |
| 12 | 0 | 0 | 8 | 5 | 0 | 1.2 | 4 | $4.6 \times 10^{-4}$ |
| 13 | 0 | 0 | 8.5 | 5 | 0 | 1.6 | 4 | $4.4 \times 10^{-4}$ |
| 14 | 0 | 0 | 9 | 5 | 0 | 2.0 | 4 | $4.6 \times 10^{-4}$ |

*1 Number of acceleration/deceleration points in one period of magnetostrictive vibration
*2 Magnitude of velocity level change between adjacent magnetostriction velocity level change points in acceleration zone or deceleration zone of magnetostrictive vibration FIGS. 6 and 7 illustrate the relationship between magnetostrictive properties and front/rear differences in forsterite film tension and insulating coating tension. With regards to the number of acceleration/deceleration points in one period of magnetostrictive vibration, no difference was observed between the influence of the front/rear difference in forsterite film tension and the influence of the front/rear difference in insulating coating tension. However, the front/rear difference in forsterite film tension and the front/rear difference in insulating coating tension were found to have differing influence on the magnitude of velocity level change between adjacent velocity level change points, and thus we determined that the front/rear difference in forsterite film tension has a greater enhancement effect on magnetostrictive properties.

The rolling direction tension of the insulating coating was calculated by cutting out a sample of 280 mm in a direction the forsterite film at one side, remeasuring the magnitude of deflection, and then converting the difference between these magnitudes of deflection to a tension according to the conversion formula.

The above measurement results show that magnetostrictive properties can be enhanced by creating a front/rear difference in both forsterite film tension and insulating coating tension of 0.5 MPa or more. Note that deflection of a steel sheet occurs when there is a difference in tension at the front and rear thereof. When such a steel sheet is placed in a flat plane, straightening of the steel sheet simultaneously applies stress to the entire steel sheet. We presume that this stress causes a beneficial change in magnetostrictive properties.

The differing influence on magnetostrictive properties of the difference in forsterite film tension and the difference in insulating coating tension may be due to slight stress distribution differences or the like that cannot be evaluated by the tension evaluation method described above since magnetostriction has high sensitivity to stress.

The following method may be used to apply stress to the entire steel sheet. Final annealing is normally performed with the steel sheet wound up in coil form. Upon completion of annealing, deflection of the steel sheet equivalent to the curvature radius of the coil arises. This deflection is normally eliminated through subsequent flattening annealing, but in the aforementioned method, the deflection of the steel sheet is retained.

Next, we investigated enhancement of magnetostrictive properties by exploiting deflection of a steel sheet. An annealing separator containing 5 parts by mass of $TiO_2$ per 100 parts by mass of MgO was applied onto the front and rear surfaces of a decarburization annealed sheet manufactured by a commonly known method in an amount of 7 $g/m^2$ on each surface and was dried. Thereafter, the sheet was subjected to final annealing at 1220° C. for 5 hours with a heating rate of 10° C./hour. Unreacted annealing separator was subsequently removed. An insulating coating containing 60% colloidal silica and aluminum phosphate was applied onto the front and rear surfaces in an amount of 5.0 $g/m^2$ on each surface and was baked at a baking temperature of 750° C. to 850° C. Thereafter, the magnitude of deflection of the steel sheet was measured and the relationship between the magnitude of deflection and magnetostrictive properties was evaluated. FIGS. 8 and 9 illustrate the relationship between the magnitude of deflection of the steel sheet and magnetostrictive properties.

With increasing magnitude of deflection, magnetostrictive properties changed disadvantageous with respect to noise in terms of both the number of acceleration/deceleration points in one period of magnetostrictive vibration and the magnitude of velocity level change between adjacent velocity level change points. We presume that deflection of the steel sheet exhibits a different trend to forsterite film tension and insulating coating tension for the following reason.

Since the steel sheet is normally continuously wound up into a coil form, the curvature radius of the steel sheet is not constant and changes continuously. Accordingly, the magnitude of deflection of the steel sheet caused by the curvature radius of the steel sheet also changes gradually in a continuous manner. As a result of this continuous change, it is not possible to apply stress uniformly to the entire steel sheet, which is thought to result in the differing change of magnetostrictive properties.

However, application of stress through creation of a difference in tension between the front and rear of a steel sheet has not been conventionally adopted since this difference in tension may lead to significant deterioration of iron loss.

We performed magnetic measurement of the samples in Experiment 2 and evaluated the magnitude of iron loss deterioration. The results are shown in FIG. 10. These results demonstrate that, as expected, iron loss deteriorated significantly both when the forsterite film had a front/rear difference in tension of 0.5 MPa or more and when the insulating coating had a front/rear difference in tension of 0.5 MPa or more.

Differences in stress of both the forsterite film and the insulating coating had the same influence on iron loss. In general, magnetostrictive properties exhibit higher sensitivity than iron loss to stress. We presume, therefore, that slight stress distribution differences and the like did not noticeably influence iron loss.

Based on these results, it is possible to conclude that no difference in the magnitude of deflection is preferable from a viewpoint of iron loss, whereas a certain degree of difference in the magnitude of deflection is preferable from a viewpoint of magnetostrictive properties.

In order to achieve a method that enables both good iron loss and good magnetostriction, we focused on the discovery that forsterite film tension and insulating coating tension have the same influence on iron loss but differing influence on magnetostrictive properties.

Specifically, we considered that by changing the balance of tension of a forsterite film and an insulating coating at the front and rear of a steel sheet while limiting the difference in total tension of the forsterite film and the insulating coating between the front and rear of the steel sheet to less than 0.5 MPa, magnetostrictive properties may be enhanced due to the degree of influence on these magnetostrictive properties differing at the front and rear of the steel sheet.

<Experiment 3>

Grinding was performed on front and rear surfaces of a decarburization annealed sheet for a grain-oriented electrical steel sheet of 0.3 mm in thickness that was manufactured by a commonly known method up to decarburization annealing. Through this grinding, the oxygen coating amount was changed to 1.2 $g/m^2$ to 2.0 $g/m^2$. Thereafter, the sheet was subjected to decarburization annealing at 840° C. for 2 minutes in a humid $H_2$ atmosphere.

Next, an annealing separator having a mixing ratio of 100 parts by mass of MgO and 5 parts by mass of $TiO_2$ was applied onto the front and rear surfaces in an amount of 7 $g/m^2$ on each surface and the sheet was then subjected to final annealing with a heating rate of 10° C./hour and 5 hours of soaking at 1180° C. Unreacted annealing separator was subsequently removed. An insulating coating containing 60% colloidal silica and magnesium phosphate was applied onto the front and rear surfaces in an amount of 5.0 $g/m^2$ to 9.0 $g/m^2$ on each surface and was baked at 850° C. Forsterite film tension and insulating coating tension were changed in this process by changing the balance at the front and rear surfaces of the oxygen coating amount and the coating amount of the insulating coating.

The front/rear differences in the total tension of the forsterite film and the insulating coating, the forsterite film tension, and the insulating coating tension were measured by the same methods as previously described, and their relationship with magnetostrictive properties and iron loss was investigated. The results are shown in FIGS. 11, 12, and 13.

The total tension is the sum of the forsterite film and the insulating coating. Therefore, in a situation in which the difference in total tension is −1.2 MPa and the difference in forsterite film tension is 0.5 MPa, the difference in insulating coating tension is −1.7 MPa. As expected, the forsterite film had a high enhancement effect with respect to magnetostrictive properties, and enhancement of magnetostrictive properties was observed when the absolute value of the difference in forsterite film tension was 0.5 MPa or more, regardless of the difference in insulating coating tension (FIGS. 11 and 12).

On the other hand, in the case of iron loss, FIG. 13 shows that a good iron loss property was achieved so long as the absolute value of the difference in total tension was less than 0.5 MPa.

Through the above, we discovered that it is only possible to achieve both good iron loss and magnetostrictive properties when setting, as conditions, that the front/rear difference in total tension of the forsterite film and the insulating coating is less than 0.5 MPa and that the front/rear difference in forsterite film tension is 0.5 MPa or more.

Accordingly, to obtain magnetostrictive properties that lower transformer noise, it is important that:

1) the number of acceleration/deceleration points that are present in a magnetostriction velocity level $d\lambda/dt$ in one period of magnetostrictive vibration is 4;

2) the magnitude of velocity level change between adjacent velocity level change points in an acceleration zone or deceleration zone of magnetostrictive vibration is $3.0 \times 10^{-4}$ $\text{sec}^{-1}$ or less;

3) a front/rear difference in total tension of a forsterite film and an insulating coating is less than 0.5 MPa; and 4) a front/rear difference in forsterite film tension is 0.5 MPa or more.

Specifically, the primary features of this disclosure are as follows.

1. A grain-oriented electrical steel sheet comprising a forsterite film and an insulating coating at a surface thereof, wherein magnetostrictive properties of the grain-oriented electrical steel sheet satisfy conditions I and II, shown below, I: the number of acceleration/deceleration points that are present in a magnetostriction velocity level $d\lambda/dt$ in one period of magnetostrictive vibration is 4, II: the magnitude of velocity level change between adjacent magnetostriction velocity level change points in an acceleration zone or deceleration zone of magnetostrictive vibration is $3.0 \times 10^{-4}$ $\text{sec}^{-1}$ or less, a front/rear difference in total tension of the forsterite film and the insulating coating is less than 0.5 MPa, and a front/rear difference in tension of the forsterite film is 0.5 MPa or more.

2. A method for manufacturing a grain-oriented electrical steel sheet, for use in manufacturing the grain-oriented electrical steel sheet according to the foregoing 1, comprising:

hot rolling a slab to obtain a hot rolled sheet;

subjecting the hot rolled sheet to hot band annealing as necessary;

subsequently subjecting the hot rolled sheet to cold rolling once, or twice or more with intermediate annealing in-between, to obtain a cold rolled sheet of final sheet thickness;

subsequently subjecting the cold rolled sheet to decarburization annealing to obtain a decarburization annealed sheet;

subsequently applying an annealing separator having MgO as a main component onto a surface of the decarburization annealed sheet and then subjecting the decarburization annealed sheet to final annealing to form the forsterite film and obtain a final annealed sheet; and subsequently applying an insulating coating treatment liquid onto the final annealed sheet and then subjecting the final annealed sheet to flattening annealing that also serves as baking to form the insulating coating, wherein in formation of the forsterite film and the insulating coating, a front/rear difference in total tension of the forsterite film and the insulating coating is adjusted to less than 0.5 MPa, and a front/rear difference in tension of the forsterite film is adjusted to 0.5 MPa or more.

3. The method for manufacturing a grain-oriented electrical steel sheet according to the foregoing 2, wherein tension of the forsterite film is adjusted through at least one of: changing formation conditions of an internal oxidation layer at front and rear steel sheet surfaces in the decarburization annealing; changing the annealing separator in terms of type; changing the annealing separator in terms of application amount; and changing an amount of electrodeposition in electrodeposition treatment performed before the final annealing.

4. The method for manufacturing a grain-oriented electrical steel sheet according to the foregoing 2 or 3, wherein tension of the insulating coating is adjusted through at least one of: changing the insulating coating in terms of thickness; and changing the insulating coating in terms of composition.

5. A method for predicting a transformer noise property, comprising predicting a noise property of a transformer in which a grain-oriented electrical steel sheet including a forsterite film and an insulating coating at a surface thereof is used by using a magnetostrictive property III and a magnetostrictive property VI of the transformer, shown below, magnetostrictive property III: the number of acceleration/deceleration points present in a magnetostriction velocity level $d\lambda/dt$ in one period of magnetostrictive vibration, magnetostrictive property VI: the magnitude of velocity level change between adjacent magnetostriction velocity level change points in an acceleration zone or deceleration zone of magnetostrictive vibration.

Advantageous Effect

According to this disclosure, it is possible to manufacture a grain-oriented electrical steel sheet having an excellent noise property in an actual transformer. Moreover, according to this disclosure, it is possible to accurately measure a noise property of a transformer in which a grain-oriented electrical steel sheet including a forsterite film and an insulating coating at the surface thereof is used.

DETAILED DESCRIPTION

Figure 1:
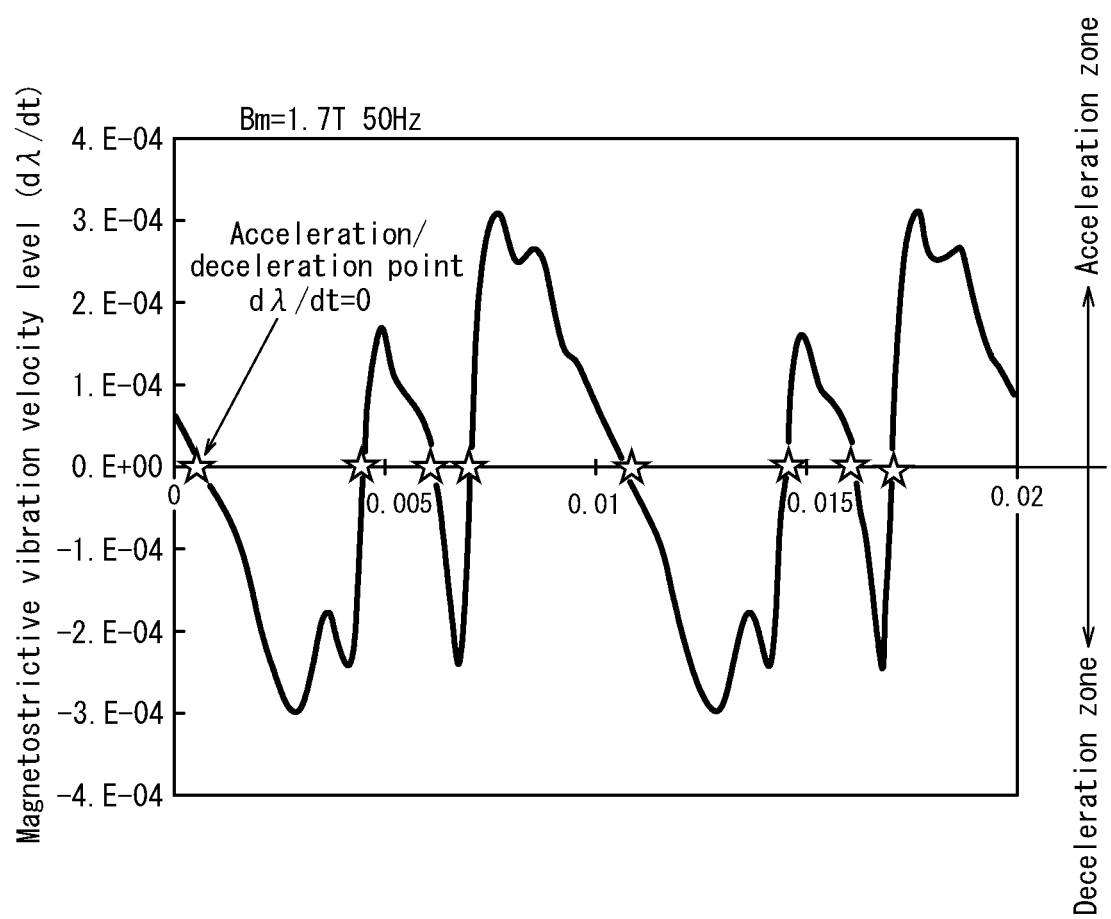
FIG. 1 illustrates an example of a magnetostrictive vibration velocity level.
Figure 2:
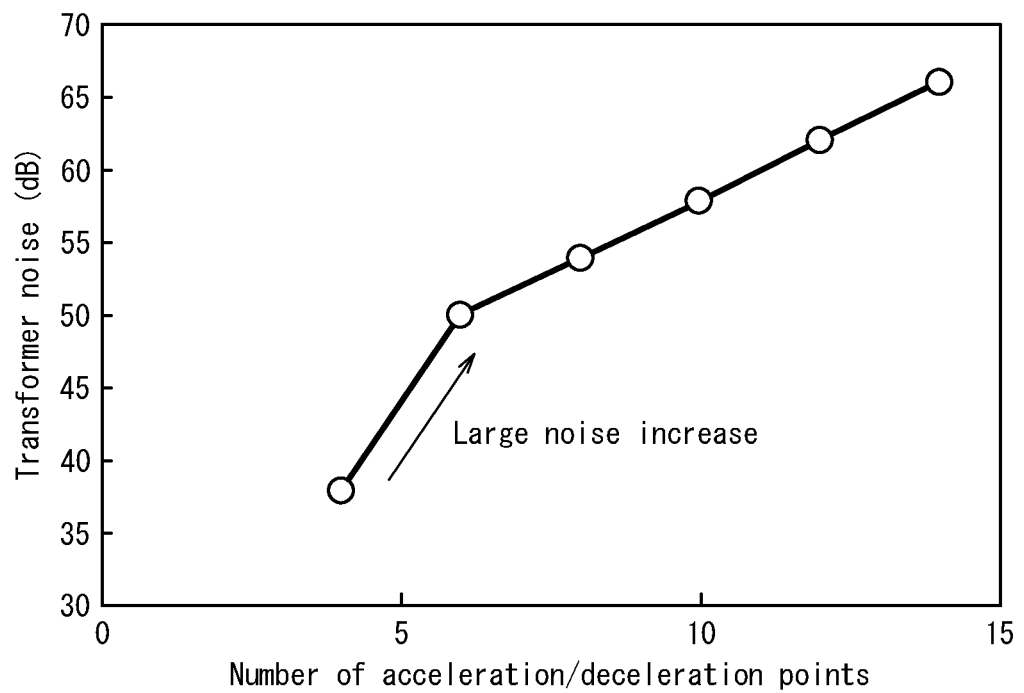
FIG. 2 illustrates a relationship between the number of acceleration/deceleration points and actual transformer noise.

The following provides a detailed description of our techniques.

First, the reasons for limitations placed on the features of this disclosure are explained.

1) We discovered that velocity change of magnetostrictive vibration has at least as great an influence on the noise of an actual transformer as conventionally known parameters.

Although the reason for this discovery is not clear, we presume that expansion and contraction of a steel sheet with repeated acceleration and deceleration requires a greater amount of energy and that this increased expansion and contraction energy is a major cause of increased noise.

Herein, the number of acceleration/deceleration points in a magnetostriction velocity level $d\lambda/dt$ (i.e., the number of instances of acceleration/deceleration at which there is a very large velocity change) in one period of magnetostrictive vibration is limited to 4, which is the minimum number of acceleration/deceleration points that occur even in the case of ideal sinusoidal wave magnetostrictive vibration. Moreover, the magnitude of velocity level change between adjacent velocity level change points in an acceleration zone or deceleration zone is preferably small and is thus limited to $3.0 \times 10^{-4}$ $sec^{-1}$ or less.

Although a smaller magnitude of velocity level change is better, a magnitude of velocity level change of approximately $1.0 \times 10^{-5}$ $sec^{-1}$ or more is preferable from an industrial viewpoint.

2) With regards to a rolling direction at the front and rear of a steel sheet, a front/rear difference in total tension of a forsterite film and an insulating coating is preferably less than 0.5 MPa, whereas a front/rear difference in forsterite film tension is preferably 0.5 MPa or more. Herein, the phrase "front/rear difference in tension" refers to the absolute value of the difference between tension at the front surface of the steel sheet and tension at the rear surface of the steel sheet.

Although the front/rear difference in total tension of the forsterite film and the insulating coating does not have a specific lower limit, a lower limit of approximately 0.1 MPa is preferable from an industrial viewpoint. Moreover, although the front/rear difference in forsterite film tension and the front/rear difference in insulating coating tension do not have a specific upper limit, an upper limit of approximately 10 MPa is preferable from an industrial viewpoint.

The difference in total tension of the forsterite film and the insulating coating between the surfaces of the steel sheet is limited to less than 0.5 MPa because stress introduced through a larger magnitude of deflection causes deterioration of iron loss. On the other hand, the front/rear difference in forsterite film tension is limited to 0.5 MPa or more because magnetostrictive properties are significantly enhanced by creating a difference in tension of the forsterite film between the front and rear of the steel sheet.

The front/rear difference in tension of the entire steel sheet can be kept to less than 0.5 MPa by applying higher insulating coating tension at a side of the steel sheet that has lower forsterite film tension. We presume that in a situation in which a surface having high forsterite film tension and a surface having high insulating coating tension are set as opposite surfaces, the direction of deflection caused by the forsterite film and the direction of deflection caused by the tension coating are in direct opposition, and thus the magnetostrictive property enhancement effects thereof act to cancel each other out. However, since the levels of these enhancement effects differ, a magnetostriction enhancement effect by the forsterite film remains even after this canceling out, resulting in enhanced magnetostrictive properties.

Next, means for changing the forsterite film tension and the insulating coating tension are explained. Conventional and commonly known methods may be used such as those described in JP 2009-235472 A and JP 2009-235473 A.

First, methods for controlling forsterite film tension are described. A cold rolled sheet for a grain-oriented electrical steel sheet manufactured by a normal method is used as a material. No specific limitations are placed on the material composition and manufacturing conditions up to cold rolling, which may be the same as those in conventional and commonly known methods. The cold rolled sheet is subsequently subjected to decarburization annealing to obtain a decarburization annealed sheet. Thereafter, an annealing separator composed mainly of MgO is applied onto the surface of the decarburization annealed sheet, which is then subjected to final annealing to form a forsterite film. The tension of the forsterite film is changed between the front and rear surfaces of the steel sheet by changing the film properties between the front and rear surfaces according to any of the following methods.

First, in a situation in which grinding is performed in pretreatment, the grinding may be performed such that the grinding amounts at the front and rear surfaces differ. Although grinding is normally performed to achieve a residual oxygen coating amount of 0.2 $g/m^2$ or less, it is preferable that grinding is performed more strongly at one surface to create a difference in the residual oxygen coating amount between the front and rear surfaces of 0.05 $g/m^2$ or more. In a situation in which electrodeposition treatment is performed in pretreatment, a front/rear difference in tension may be created through the amount of electrodeposition. The electrodeposited material may be a metal such as Cu, Ni, Co, or Sn as disclosed, for example, in JP H9-87744 A, and may be electrodeposited in a greater amount at a coil bend inner surface side such as to create a difference in the amount of electrodeposition between the front and rear surfaces of 0.2 $mg/m^2$ or more. This electrodeposition treatment is not limited to being performed before decarburization annealing, and may alternatively be performed after decarburization annealing.

Herein, a separator composed mainly of MgO is used as an annealing separator. Examples of commonly known additives that may be used with the annealing separator include compounds containing an element such as Ti, Sb, Mg, Ca, Sr, Sn, B, Na, K, Cl, F, or Br.

Such additives may also be used to change the forsterite film tension between the front and rear surfaces. In other words, the forsterite film tension may be changed by adding such additives in different amounts at the front and rear surfaces. The conditions for creating a front/rear difference in tension vary depending on the type of additive that is used. In the case of Ti, Sb, Mg, Ca, Sr, or Sn, it is preferable to create a difference, in terms of metal, of approximately 0.2 parts by mass per 100 parts by mass of MgO, whereas in the case of B, Na, K, Cl, F, or Br, it is preferable to create a difference of 0.001 parts by mass or more per 100 parts by mass of MgO.

Next, methods for controlling insulating coating tension are described. A final annealed sheet for a grain-oriented electrical steel sheet obtained after secondary recrystallization by coil annealing is used as a material. No specific limitations are placed on the composition of the material. Since final annealing is normally performed over a long period, such as several days, it is standard practice for the annealing to be performed with the steel sheet wound up in coil form. Herein, final annealing is preferably also performed by this conventional method.

The surface of the coil obtained after final annealing is cleaned by water washing or phosphoric acid pickling prior to application of an insulating coating treatment liquid. This cleaning can also be performed by a conventional method. After the cleaning, the insulating coating treatment liquid is applied. Although the coating itself may be a conventional tension-applying coating, it is a feature of this disclosure that a higher insulating coating tension is applied at the opposite surface to the surface at which a higher forsterite film tension is applied.

The following describes a suitable tension-applying coating. The most commonly used type of coating is a phosphate-silica-based coating. In terms of composition, the phosphate-silica-based coating preferably contains, by solid content ratio, approximately 10 parts by mass to 80 parts by mass of one or more phosphates of Al, Mg, Ca, Fe, Mn, or the like per 20 parts by mass of colloidal silica.

Moisture absorption resistance is insufficient if the phosphate is contained in too small a proportion, whereas the tension is reduced and the iron loss reducing effect is weakened if the phosphate is contained in too large a proportion because this reduces the relative amount of the colloidal silica. Chromic anhydride and/or a chromic acid compound may be compounded in a total amount of 3 parts by mass to 20 parts by mass with the aim of enhancing moisture absorption. Furthermore, inorganic mineral particles (a powder or the like) such as silica or alumina may be used since compounding thereof enhances sticking resistance. The mixing ratio of these inorganic mineral particles is preferably no greater than approximately 1 part by mass so as not to reduce the stacking factor.

Techniques that do not use chromium have recently been developed for providing environmentally friendly coatings. When such techniques are adopted, a metal sulfate, chloride, colloidal oxide, borate, or the like of Mg, Al, Fe, Bi, Co, Mn, Zn, Ca, Ba, Sr, Ni, or the like is used in place of the chromic anhydride or chromic acid compound. The total amount thereof is preferably approximately 3 parts by mass to 30 parts by mass.

Herein, examples of means for changing the insulating coating tension include changing the insulating coating in terms of thickness and/or composition (i.e., a method in which the application amount of the coating is changed and a method in which the type of the coating is changed). Conventionally, the application amount of the coating is approximately 2 $g/m^2$ to 8 $g/m^2$ per surface and approximately 4 $g/m^2$ to 16 $g/m^2$ in total for both surfaces. Even in a situation in which the application amount is changed, the total application amount for both surfaces is preferably the same as conventionally used. An excessively large application amount reduces the stacking factor and leads to deterioration of magnetic properties, whereas an excessively small application amount reduces the tension and prevents the achievement of good magnetic properties.

Examples of methods for changing the type of the coating include a method in which the type of phosphate is changed and a method in which the mixing ratio of the coating is changed as disclosed, for example, in "IEEE Transactions on Magnetics, Vol. Mag-15, No. 6, November 1979". After application and drying of the coating, flattening annealing that also serves as baking is performed. In the flattening annealing, it is important that the annealing temperature and tension applied to the steel sheet are controlled such that residual coil bending caused by the final annealing is as small as possible. The reason for this is that if coil bending remains, it is not possible to obtain the desired magnetostrictive properties even when the forsterite film tension and the insulating coating tension are controlled to within the scope of this disclosure. It is when the influence of coil bending is at a negligible level that the desired magnetostrictive properties are achieved through the tension control disclosed herein.

Through our techniques, it is possible to predict a noise property of a transformer in which a grain-oriented electrical steel sheet is used using the number of acceleration/deceleration points in a magnetostriction velocity level $d\lambda/dt$ (i.e., the number of instances of acceleration/deceleration at which a large velocity change occurs) in one period of magnetostrictive vibration (magnetostrictive property III) and the magnitude of velocity level change between adjacent velocity level change points in an acceleration zone or deceleration zone (magnetostrictive property VI).

The following describes an example of an acceleration/deceleration point measurement method.

First, a higher-harmonic is superimposed on an excitation voltage to change magnetostrictive properties. For example, a 300 kVA actual transformer is assembled using a grain-oriented electrical steel sheet of 0.27 mm in thickness and the noise thereof is then measured at 50 Hz and 1.7 T. Acceleration/deceleration points (magnetostrictive property III) can be determined by counting the number of acceleration/deceleration points in one period of magnetostrictive vibration. Magnetostrictive vibration can be measured by a strain gauge method, or using a laser displacement meter or a laser Doppler vibrometer. Herein, magnetostrictive vibration properties are preferably evaluated using a laser Doppler vibrometer due to the simplicity thereof.

Next, a method for determining the magnitude of velocity level change between adjacent velocity level change points in an acceleration zone or deceleration zone is described.

In our techniques, the difference between adjacent local maximum and minimum values is investigated as an evaluation parameter for velocity change. This focuses on velocity change within an acceleration/deceleration zone and does not include velocity change spanning across both acceleration and deceleration zones.

Figure 3:
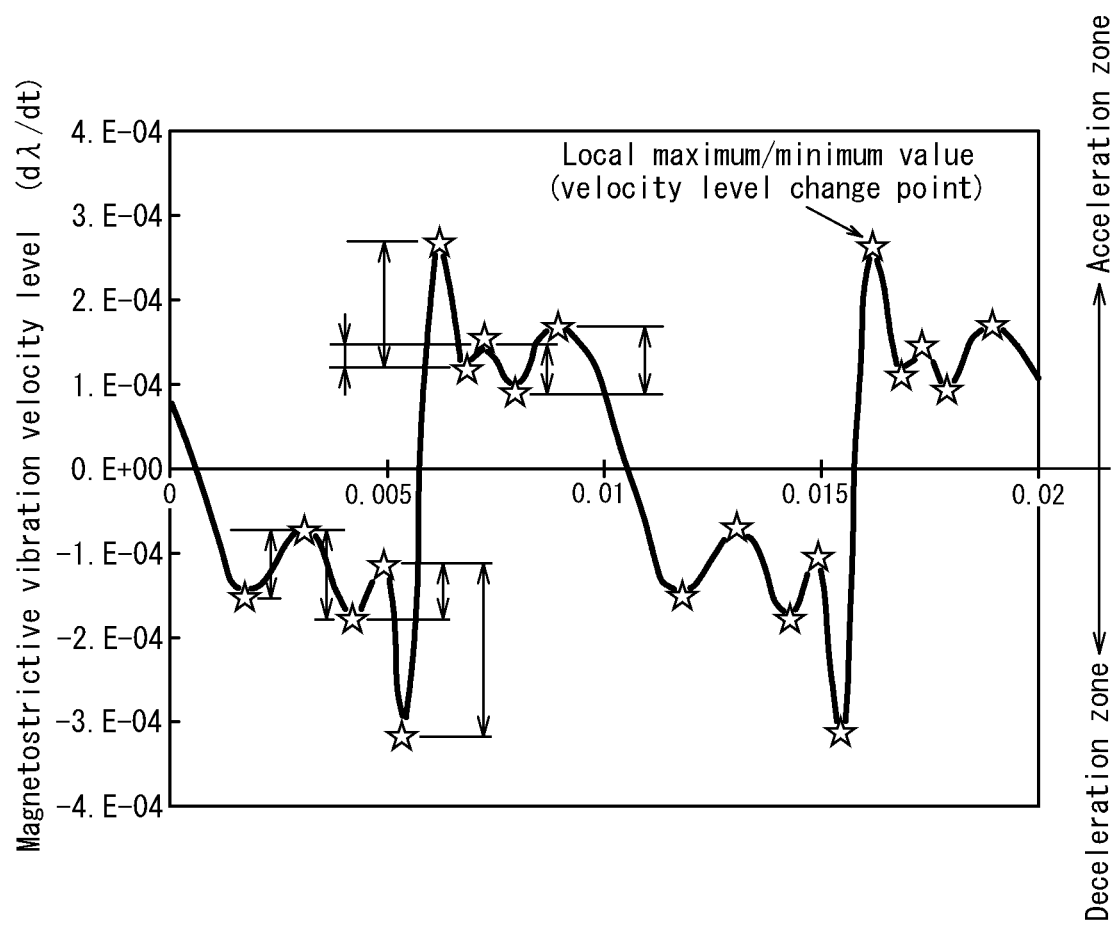
FIG. 3 illustrates the magnitude of velocity level change between adjacent velocity level change points of magnetostrictive vibration.
Figure 4:
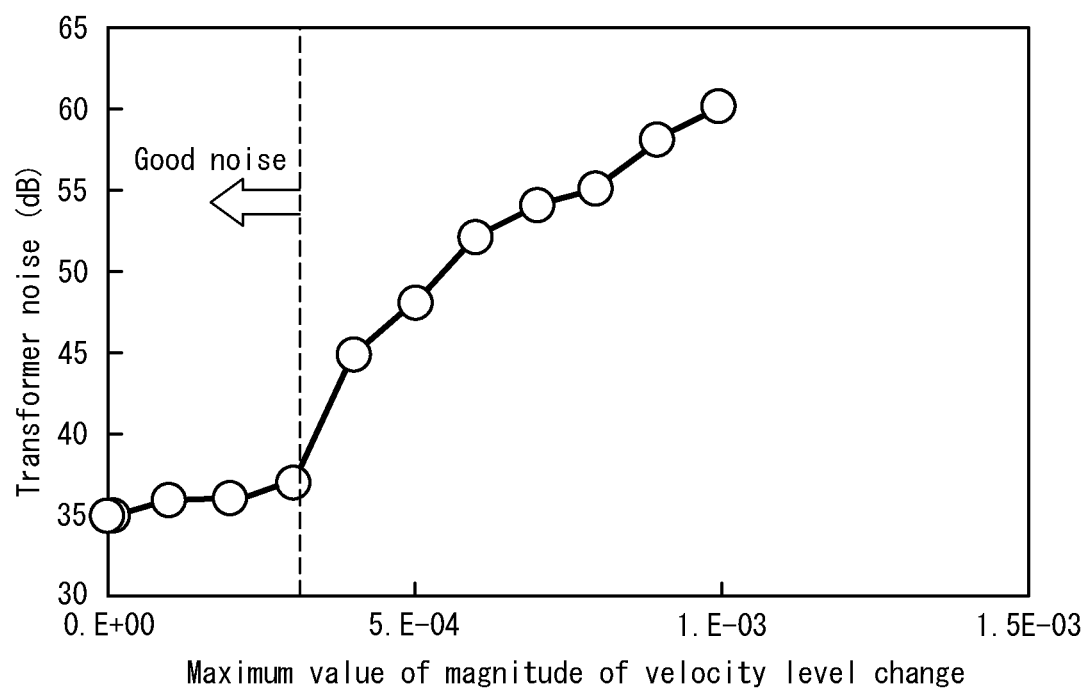
FIG. 4 illustrates a relationship between a maximum value of the magnitude of velocity level change and noise.
Figure 5:
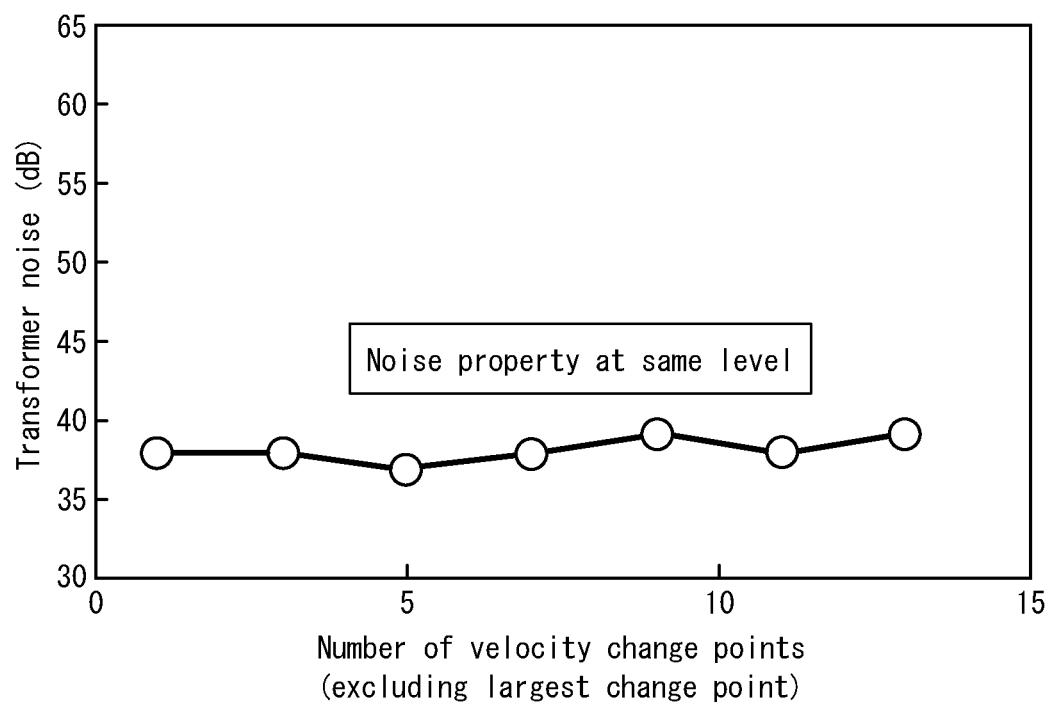
FIG. 5 illustrates a relationship between the number of acceleration/deceleration points and actual transformer noise.
Figure 6:
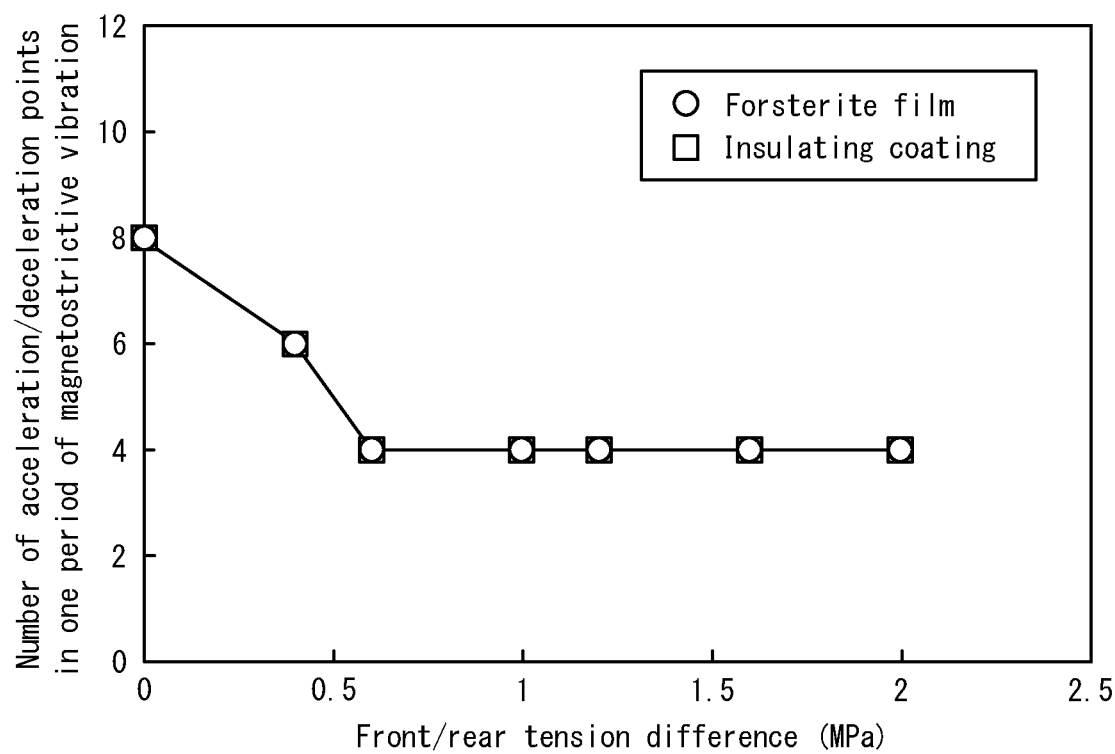
FIG. 6 illustrates a relationship between film tension differences and a magnetostrictive property (number of acceleration/deceleration points in one period of magnetostrictive vibration)
Figure 7:
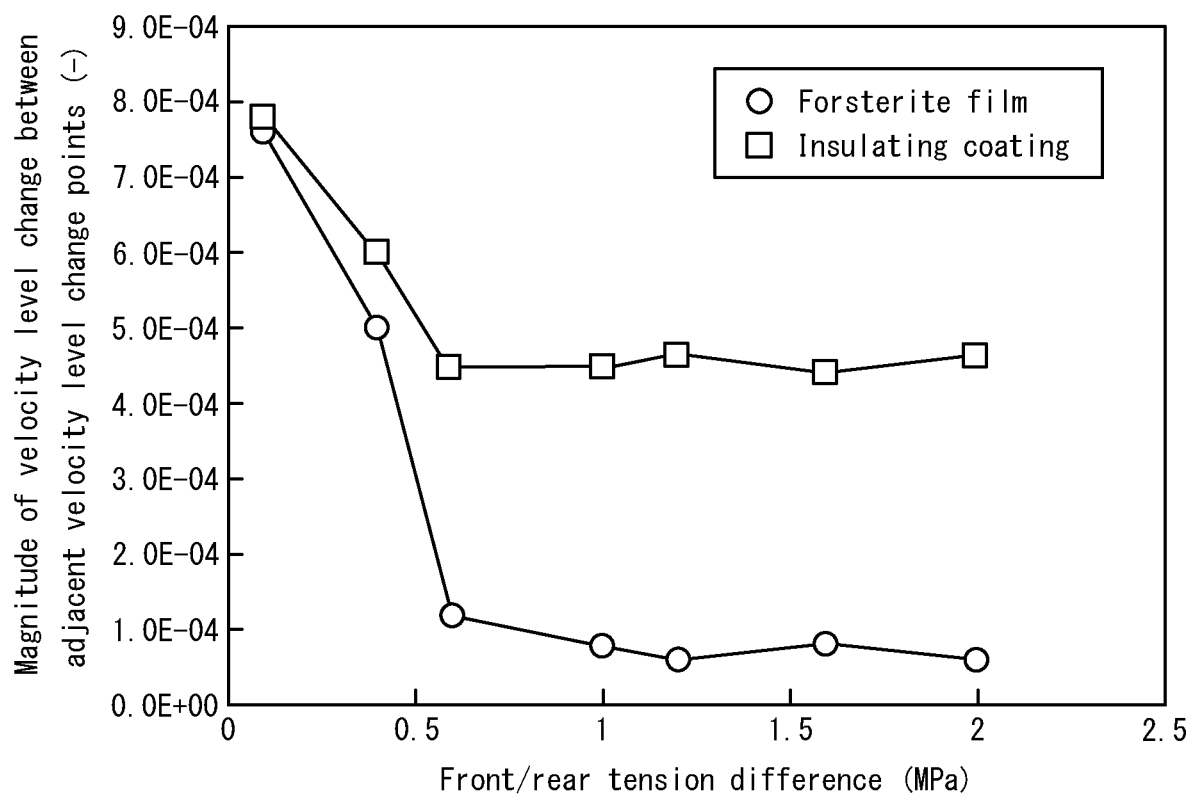
FIG. 7 illustrates a relationship between film tension differences and a magnetostrictive property (magnitude of velocity level change between adjacent velocity level change points)
Figure 8:
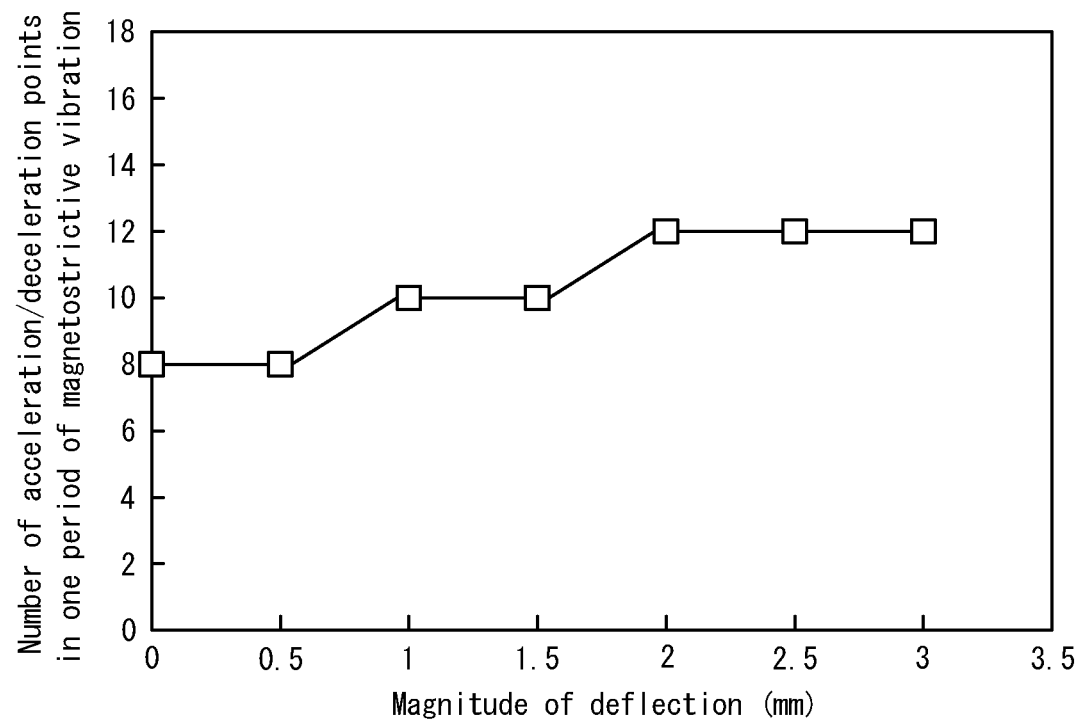
FIG. 8 illustrates a relationship between the magnitude of deflection of a steel sheet and a magnetostrictive property (number of acceleration/deceleration points in one period of magnetostrictive vibration)
Figure 9:
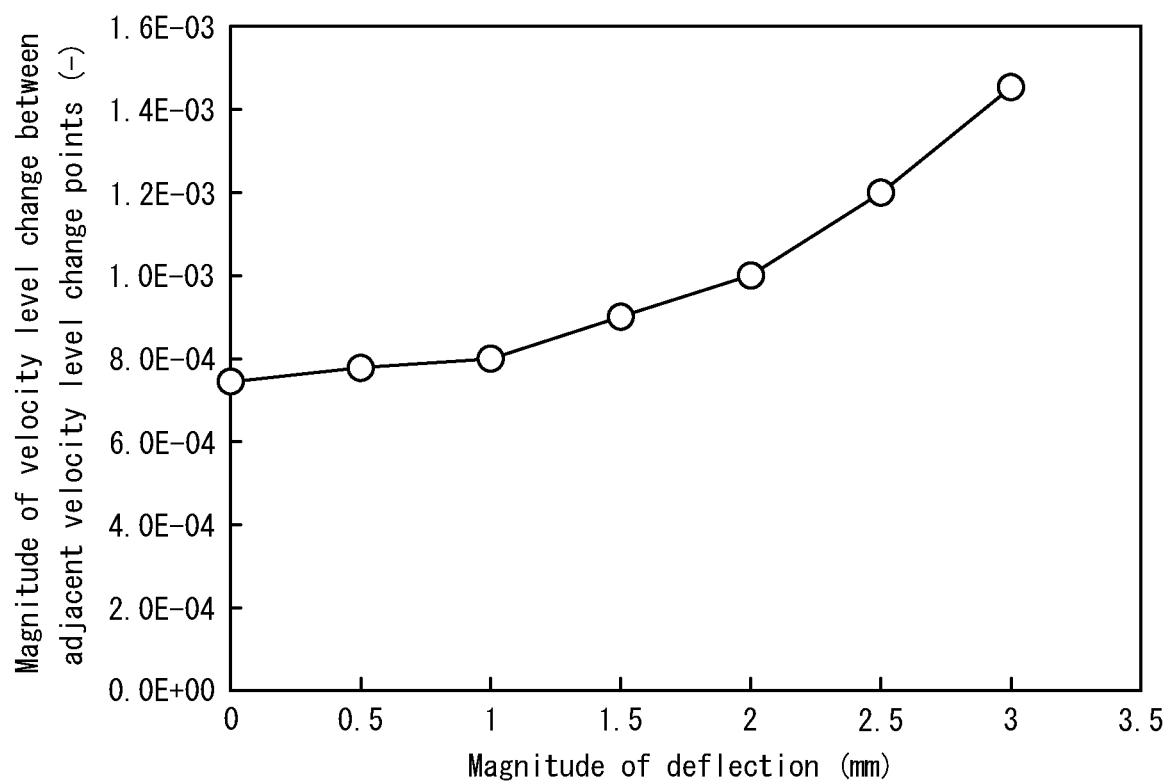
FIG. 9 illustrates a relationship between the magnitude of deflection of a steel sheet and a magnetostrictive property (magnitude of velocity level change between adjacent velocity level change points)
Figure 10:
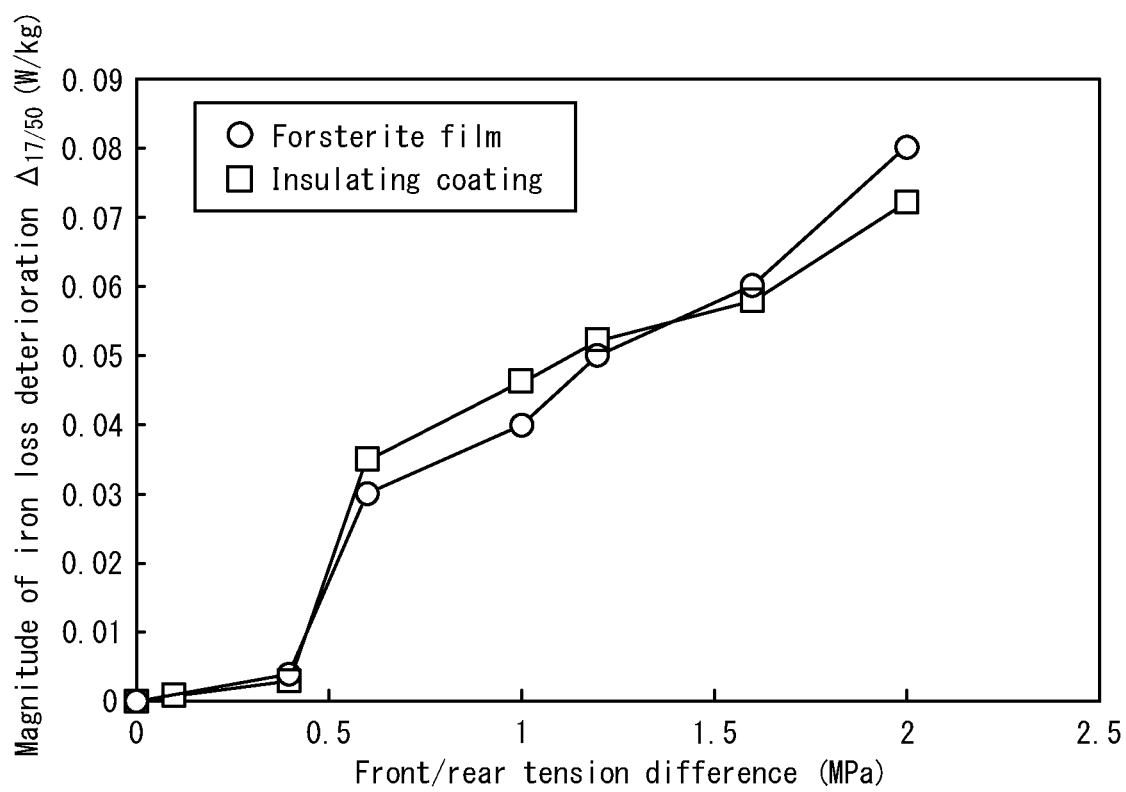
FIG. 10 illustrates results of evaluation of the magnitude of iron loss deterioration performed through magnetic measurement of samples in Experiment 2.
Figure 11:
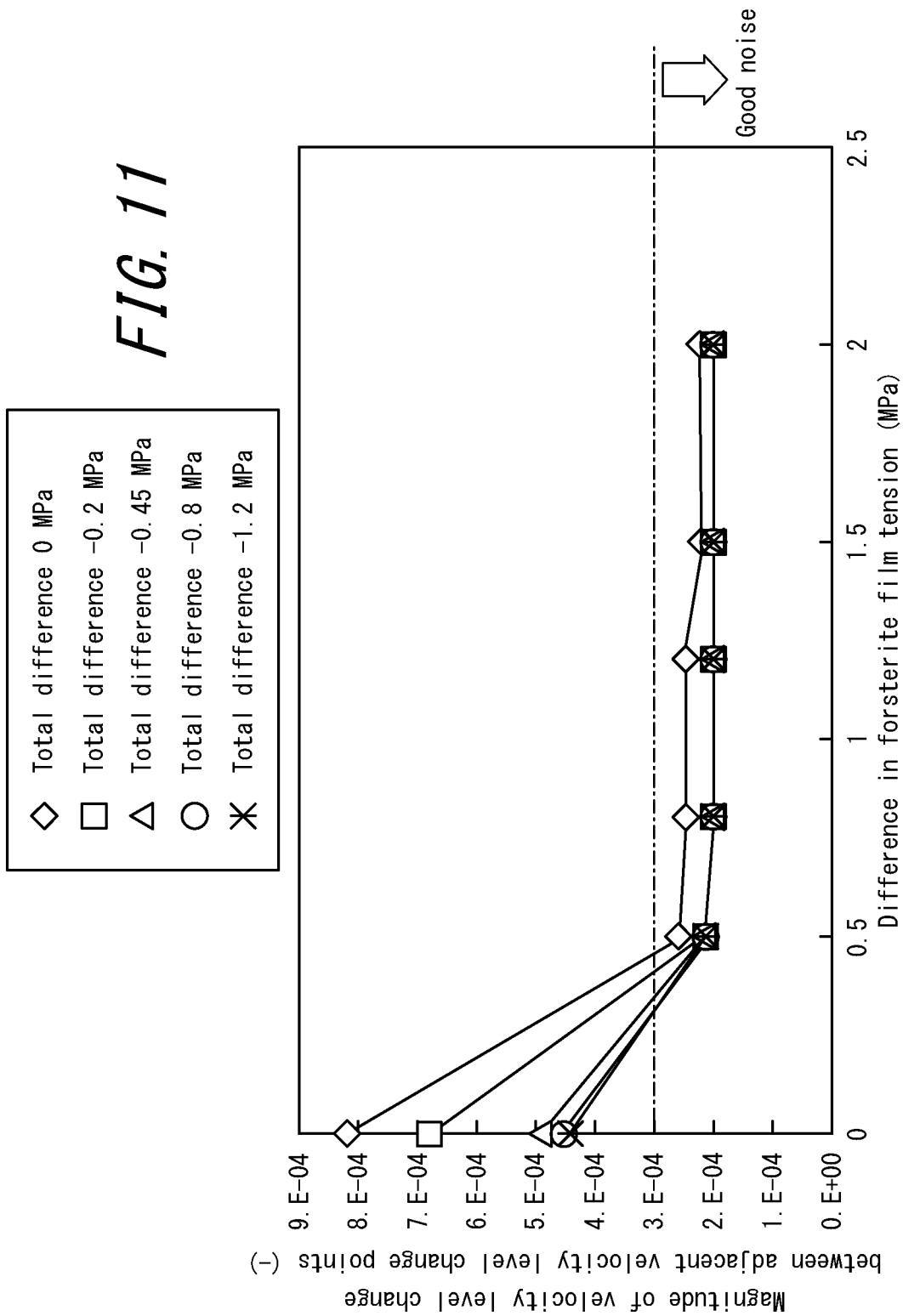
FIG. 11 illustrates a relationship between forsterite film tension difference and a magnetostrictive property (magnitude of velocity level change between adjacent velocity level change points) for various front/rear differences in total tension (total difference) of a forsterite film and an insulating coating.
Figure 12:
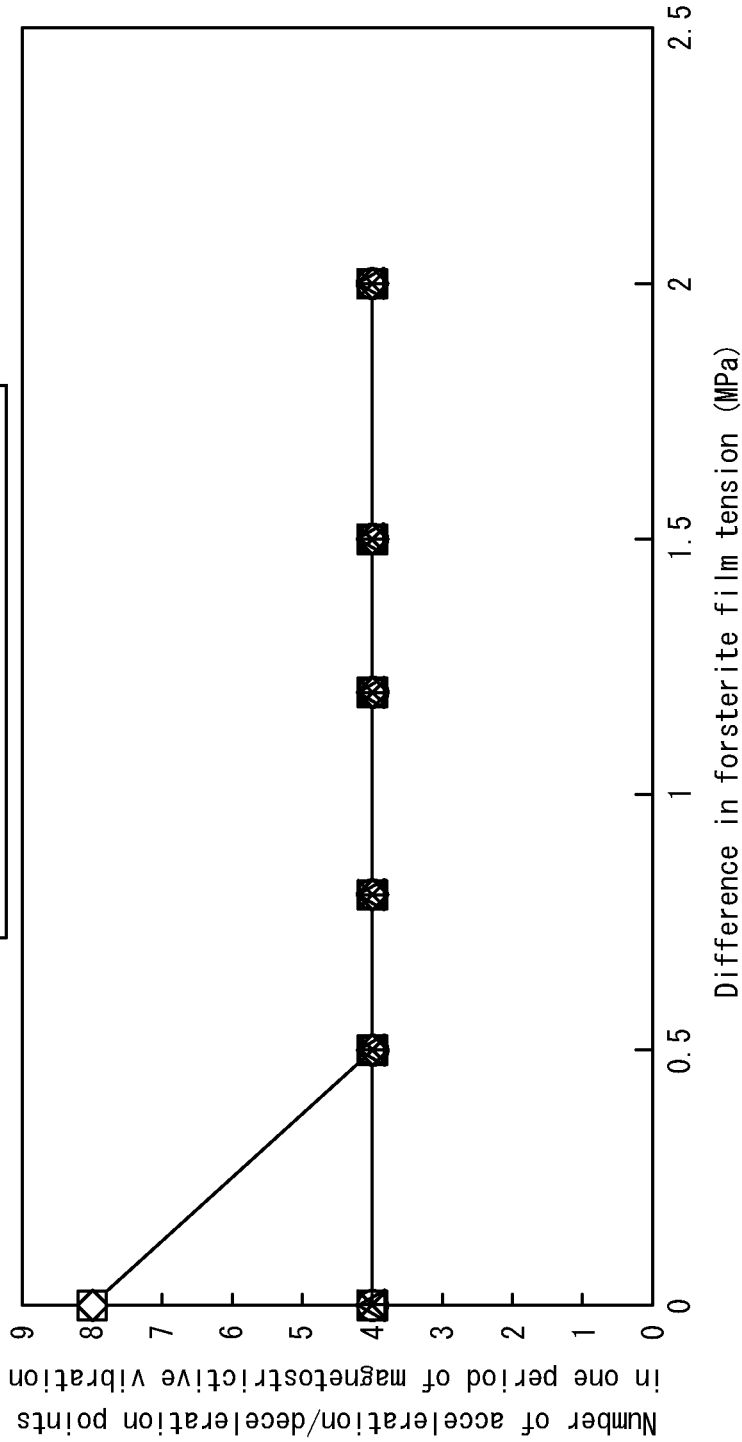
FIG. 12 illustrates a relationship between forsterite film tension difference and a magnetostrictive property (number of acceleration/deceleration points in one period of magnetostrictive vibration) for various front/rear differences in total tension (total difference) of a forsterite film and an insulating coating.
Figure 13:
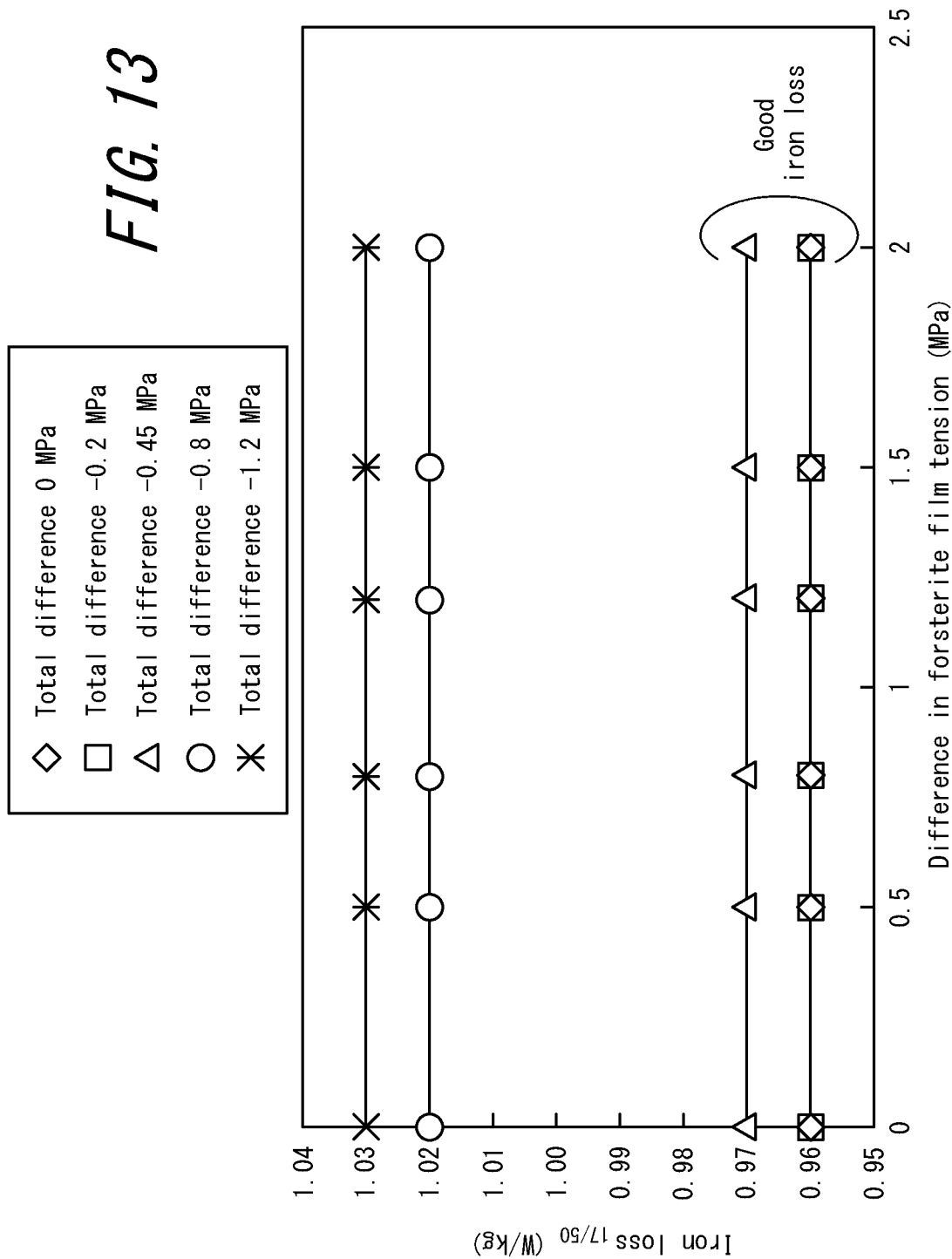
FIG. 13 illustrates a relationship between forsterite film tension difference and iron loss for various front/rear differences in total tension (total difference) of a forsterite film and an insulating coating.

As illustrated in the previously described FIG. 3, a number of local maximum values and local minimum values are present in one period of a magnetostriction waveform.

In our techniques, the magnitude of velocity level change between adjacent velocity level change points in an acceleration zone or deceleration zone (magnetostrictive property VI) can be determined by investigating a maximum value of differences between adjacent local maximum and minimum values of the magnetostriction velocity level (magnitude of velocity level change).

Velocity change points occurring at positions indicated by stars in FIG. 3 are points at which:

1) an increasing rate of acceleration changes to a decreasing rate of acceleration;
2) a decreasing rate of acceleration changes to an increasing rate of acceleration;
3) an increasing rate of deceleration changes to a decreasing rate of deceleration; or
4) a decreasing rate of deceleration changes to an increasing rate of deceleration.

The number of instances of acceleration/deceleration and the magnitude of velocity level change are determined by measuring the velocity change behavior of magnetostrictive vibration as described above. It is then confirmed whether or not the number of instances of acceleration/deceleration (magnetostrictive property III) is 4, and whether or not the magnitude of velocity level change (magnetostrictive property VI) is $3.0 \times 10^{-4}$ sec$^{-1}$ or less.

The transformer is determined is have a good noise property if the magnetostrictive property III and the magnetostrictive property VI both satisfy the above conditions (i.e., if the magnetostrictive property III is 4 and the magnetostrictive property VI is $3.0 \times 10^{-4}$ sec$^{-1}$ or less).

EXAMPLES

Example 1

A plurality of decarburization annealed sheets for grain-oriented electrical steel sheets of differing compositions that had been manufactured by a commonly known method up to decarburization annealing and that had a thickness of 0.3 mm were used (chemical compositions of materials A and B are shown in Table 2; % values in Table 2 are in mass % and ppm values in Table 2 are in mass ppm, the balance being Fe and incidental impurities). Grinding of front and rear surfaces of each of the decarburization annealed sheets was performed to change the oxygen coating amount to 0.9 g/m$^2$ to 2.0 g/m$^2$. Thereafter, Ni was electrodeposited on the front and rear surfaces in a range of 0 mg/m$^2$ to 0.4 mg/m$^2$ and decarburization annealing was performed for 2 minutes at 860° C. in a humid H$_2$ atmosphere.

Next, an annealing separator having a mixing ratio of 100 parts by mass of MgO and 5 parts by mass of TiO$_2$ was applied onto the front and rear surfaces in an amount of 8 g/m$^2$ on each surface and then final annealing was performed at a heating rate of 10° C./hour and with 5 hours of soaking at 1200° C.

Thereafter, excess annealing separator was removed. The type of insulating coating was changed at the front and rear as shown in Table 3. "Magnesium phosphate" in Table 3 indicates an insulating coating treatment liquid having a mixing ratio of 50 mass % of magnesium phosphate, 40 mass % of colloidal silica, 9.5 mass % of chromic anhydride, and 0.5 mass % of silica powder. "Aluminum phosphate" in Table 3 indicates an insulating coating treatment liquid having a mixing ratio of 50 mass % of aluminum phosphate, 40 mass % of colloidal silica, 9.5 mass % of chromic anhydride, and 0.5 mass % of silica powder. These insulating coating treatment liquids were applied such that the dried mass on each surface was 5 g/m$^2$ to 8 g/m$^2$, and were dried at 300° C. for 1 minute. Thereafter, flattening annealing was performed in a dry N$_2$ atmosphere at 850° C. for 2 minutes under conditions such that the applied tension was 13 MPa to obtain a grain-oriented electrical steel sheet.

Magnetic properties and magnetostrictive properties of each grain-oriented electrical steel sheet obtained in this manner were measured. Additionally, differences between the surfaces of the steel sheet in terms of forsterite film tension, insulating coating tension, and total tension thereof were determined. Each electrical steel sheet was also used as a material for manufacturing a 1,000 kVA transformer, a noise property of which was then evaluated at 1.5 T and 60 Hz.

Table 3 shows details of the manufacturing conditions, such as the oxygen coating amount, and also shows the steel sheet tension, iron loss, and magnetostrictive properties. Note that tension differences in Table 3 each represent the real value of the front/rear difference in tension, but in comparison with front/rear differences in tension that are prescribed in the present disclosure, it is the absolute values thereof that are compared.

TABLE 2

| Composition | C (%) | Si (%) | Mn (%) | Al (ppm) | N (ppm) | S (ppm) | Se (ppm) | Ni (%) | Cu (%) | P (%) | Mo (%) | Cr (%) | Sb (ppm) | Sn (ppm) |
|---|---|---|---|---|---|---|---|---|---|---|---|---|---|---|
| A | 0.07 | 3.4 | 0.06 | 250 | 90 | 15 | 170 | 0.01 | 0.1 | 0.05 | 0.002 | 0.01 | 400 | 10 |
| B | 0.04 | 3.4 | 0.07 | 10 | 20 | 10 | 200 | 0.01 | 0.07 | 0.05 | 0.002 | 0.01 | 300 | 10 |

TABLE 3

| | | Oxygen coating amount (g/m$^2$) | | Ni electrodepostion amount (g/m$^2$) | | Main agent of insulating coating | | | |
|---|---|---|---|---|---|---|---|---|---|
| | | | | | | | Front surface | | Rear surface |
| No. | Material | Front surface | Rear surface | Front surface | Rear surface | Front surface | application amount (g/m$^2$) | Rear surface | application amount (g/m$^2$) |
| 1 | A | 1.8 | 1.8 | 0 | 0 | Aluminum phosphate | 6 | Aluminum phosphate | 6 |
| 2 | A | 1.8 | 1.1 | 0.2 | 0 | Aluminum phosphate | 6 | Aluminum phosphate | 6 |

TABLE 3-continued

| No. | | | | | | | | | |
|---|---|---|---|---|---|---|---|---|---|
| 3 | A | 1.5 | 1.1 | 0.3 | 0.1 | Aluminum phosphate | 6 | Magnesium phosphate | 6 |
| 4 | A | 0.9 | 1.8 | 0 | 0.1 | Aluminum phosphate | 6 | Magnesium phosphate | 6.5 |
| 5 | A | 0.7 | 2.0 | 0 | 0.5 | Magnesium phosphate | 7 | Aluminum phosphate | 5 |
| 6 | B | 1.8 | 1.8 | 0 | 0 | Aluminum phosphate | 6 | Aluminum phosphate | 6 |
| 7 | B | 0.7 | 2.0 | 0 | 0.5 | Magnesium phosphate | 7 | Aluminum phosphate | 5 |
| 8 | B | 0.9 | 1.8 | 0 | 0.1 | Aluminum phosphate | 6 | Magnesium phosphate | 6.5 |

| No. | Forsterite film tension difference (MPa) | Insulating coating tension difference (MPa) | Total tension difference (MPa) | Magnitude of velocity level change (sec$^{-1}$) *1 | Acceleration/ deceleration points *2 | $W_{17/50}$ (W/kg) | Transformer noise (dB) | Remarks |
|---|---|---|---|---|---|---|---|---|
| 1 | 0 | 0 | 0 | $9.2 \times 10^{-4}$ | 8 | 0.95 | 58 dB | Comparative Example |
| 2 | 0.7 | 0 | 0.7 | $0.5 \times 10^{-4}$ | 4 | 1.09 | 42 dB | Comparative Example |
| 3 | 0.7 | −0.5 | −0.2 | $2.2 \times 10^{-4}$ | 4 | 0.94 | 42 dB | Example |
| 4 | −0.7 | −0.7 | −1.4 | $0.4 \times 10^{-4}$ | 4 | 1.12 | 43 dB | Comparative Example |
| 5 | −1.1 | 1.2 | 0.1 | $2.6 \times 10^{-4}$ | 4 | 0.95 | 43 dB | Example |
| 6 | 0 | 0 | 0 | $2.8 \times 10^{-3}$ | 12 | 1.01 | 68 dB | Comparative Example |
| 7 | −1.1 | 1.2 | 0.1 | $5.5 \times 10^{-4}$ | 6 | 0.95 | 65 dB | Comparative Example |
| 8 | −0.7 | −0.7 | −1.4 | $4.5 \times 10^{-4}$ | 4 | 1.18 | 65 dB | Comparative Example |

*1 Magnitude of velocity level change between adjacent magnetostriction velocity level change points in acceleration zone or deceleration zone of magnetostrictive vibration
*2 Number of acceleration/deceleration points in one period of magnetostrictive vibration Upon comparison of No. 1 and No. 6 in which there were no tension differences as conventionally, it can be concluded that a feature of materials A and B is that material B has higher magnetostrictive property parameters and a poorer iron loss property than material A. Accordingly, material A has better values for parameters, other than tension, that are conventionally known to influence magnetostrictive properties and iron loss (for example, magnetic flux density and crystal orientation), and thus material A has better magnetic properties and magnetostrictive properties than material B prior to adoption of our techniques.

It can be seen from Table 3 that No. 3 and No. 5, which are within the scope of this disclosure, achieved both transformer noise reduction and iron loss reduction. On the other hand, although sample No. 7 in which film tensions were within the scope of this disclosure had slightly enhanced magnetostrictive properties compared to samples outside the scope of this disclosure, magnetostrictive properties were not enhanced sufficiently to achieve a good noise property since the initial magnetostrictive properties (sample No. 6) were poor.

Example 2

A plurality of decarburization annealed sheets for grain-oriented electrical steel sheets of differing compositions that had been manufactured by a commonly known method up to decarburization annealing and that had a thickness of 0.23 mm were used (chemical compositions of materials C and D are shown in Table 4; % values in Table 4 are in mass % and ppm values in Table 4 are in mass ppm, the balance being Fe and incidental impurities). An annealing separator having a mixing ratio of 100 parts by mass of MgO and 4.5 parts by mass of TiO$_2$ was applied onto front and rear surfaces of each decarburization annealed sheet in an amount of 8 g/m$^2$ on each surface. Thereafter, sodium borate aqueous solution was applied onto the front surface and the rear surface by spraying such that the amounts of B and Na were each adjusted to 0 parts by mass to 0.03 parts by mass per 100 parts by mass of MgO at both surfaces. Final annealing was then performed at a heating rate of 120° C./hour and with 20 hours of soaking at 1200° C.

Next, excess annealing separator was removed and an insulating coating treatment liquid having a mixing ratio of 50 mass % of magnesium phosphate, 40 mass % of colloidal silica, 9.5 mass % of chromic anhydride, and 0.5 mass % of silica powder was applied such as to have a dry mass of 5 g/m$^2$ to 10 g/m$^2$ on each surface. Drying was performed for 1 minute at 250° C., and then flattening annealing was performed in a dry N$_2$ atmosphere at 820° C. for 2 minutes and under conditions such that the applied tension was 15 MPa to obtain a grain-oriented electrical steel sheet.

Magnetic properties and magnetostrictive properties of each grain-oriented electrical steel sheet obtained in this manner were measured. Additionally, differences between the surfaces of the steel sheet in terms of forsterite film tension, insulating coating tension, and total tension thereof were determined. Each electrical steel sheet was also used as a material for manufacturing a 750 kVA transformer, a noise property of which was then evaluated at 1.6 T and 60 Hz.

Table 5 shows details of the film applying conditions, such as the amounts of B and Na per 100 parts by mass of MgO, and also shows the steel sheet tension, iron loss, and magnetostrictive properties. Note that tension differences in Table 5 each represent the real value of the front/rear difference in tension, but in comparison with front/rear differences in tension that are prescribed in the present disclosure, it is the absolute values thereof that are compared.

TABLE 4

| Composition | C (%) | Si (%) | Mn (%) | Al (ppm) | N (ppm) | S (ppm) | Se (ppm) | Ni (%) | Cu (%) | P (%) | Mo (%) | Cr (%) | Sb (ppm) | Sn (ppm) |
|---|---|---|---|---|---|---|---|---|---|---|---|---|---|---|
| C | 0.07 | 3.2 | 0.05 | 250 | 100 | 10 | 100 | 0.1 | 0.01 | 0.01 | 0.001 | 0.05 | 250 | 100 |
| D | 0.06 | 3.2 | 0.05 | 20 | 15 | 10 | 120 | 0.1 | 0.01 | 0.01 | 0.001 | 0.05 | 250 | 100 |

TABLE 5

| | | Na and B content | | | | Insulating coating | | Forsterite film |
|---|---|---|---|---|---|---|---|---|
| | | (parts by mass per 100 parts by mass of MgO) | | | | Front surface | Rear surface | tension |
| No. | Material | Na at front surface | Na at rear surface | B at front surface | B at rear surface | application amount (g/m$^2$) | application amount (g/m$^2$) | difference (MPa) |
| 1 | C | 0 | 0 | 0 | 0 | 6 | 6 | 0 |
| 2 | C | 0.025 | 0 | 0.01 | 0 | 6 | 6 | 0.8 |
| 3 | C | 0.025 | 0.01 | 0.025 | 0.01 | 4 | 6 | 0.7 |
| 4 | C | 0.01 | 0.025 | 0.01 | 0.025 | 4 | 6 | −0.7 |
| 5 | C | 0 | 0.025 | 0 | 0.025 | 8 | 6 | −1.1 |
| 6 | D | 0 | 0 | 0 | 0 | 6 | 6 | 0 |
| 7 | D | 0 | 0.025 | 0 | 0.025 | 8 | 6 | −1.1 |
| 8 | D | 0.01 | 0.025 | 0.01 | 0.025 | 4.5 | 6.5 | −0.7 |

| No. | Insulating coating tension difference (MPa) | Total tension difference (MPa) | Magnitude of velocity level change (sec$^{-1}$) *1 | Acceleration/deceleration points *2 | W$_{17/50}$ (W/kg) | Transformer noise (dB) | Remarks |
|---|---|---|---|---|---|---|---|
| 1 | 0 | 0 | 7.2 × 10$^{-4}$ | 8 | 0.81 | 53 dB | Comparative Example |
| 2 | 0 | 0.8 | 1.1 × 10$^{-4}$ | 4 | 0.92 | 41 dB | Comparative Example |
| 3 | −0.5 | −0.2 | 2.4 × 10$^{-4}$ | 4 | 0.82 | 40 dB | Example |
| 4 | −0.7 | −1.4 | 0.8 × 10$^{-4}$ | 4 | 0.91 | 39 dB | Comparative Example |
| 5 | 1.2 | 0.1 | 1.9 × 10$^{-4}$ | 4 | 0.81 | 41 dB | Example |
| 6 | 0 | 0 | 1.8 × 10$^{-3}$ | 12 | 0.88 | 53 dB | Comparative Example |
| 7 | 1.2 | 0.1 | 4.9 × 10$^{-4}$ | 6 | 0.88 | 51 dB | Comparative Example |
| 8 | −0.7 | −1.4 | 2.8 × 10$^{-4}$ | 4 | 0.98 | 41 dB | Comparative Example |

*1 Magnitude of velocity level change between adjacent magnetostriction velocity level change points in acceleration zone or deceleration zone of magnetostrictive vibration
*2 Number of acceleration/deceleration points in one period of magnetostrictive vibration In the same way as in Example 1, upon comparison of No. 1 and No. 6 in which there were no tension differences as conventionally, it can be concluded that a feature of materials C and D is that material D has higher magnetostrictive property parameters and a poorer iron loss property than material C. Accordingly, material C has better values for parameters, other than tension, that are conventionally known to influence magnetostrictive properties and iron loss (for example, magnetic flux density and crystal orientation), and thus material C has better magnetic properties and magnetostrictive properties than material D prior to adoption of our techniques.

It can be seen from Table 5 that No. 3 and No. 5, which are within the scope of this disclosure, achieved both good transformer noise and good iron loss. On the other hand, although sample No. 7 in which film tensions were within the scope of this disclosure had slightly enhanced magnetostrictive properties compared to samples outside the scope of this disclosure, magnetostrictive properties were not enhanced sufficiently to achieve a good noise property since the initial magnetostrictive properties (sample No. 6) were poor.

Furthermore, it can be seen that when the surface at which forsterite film tension is high and the surface at which insulating coating tension is high are the same surface as in No. 8, although magnetostrictive properties that enhance the noise level are obtained because there is no canceling out of magnetostriction enhancement effects, deflection of the steel sheet arises, and this deflection causes significant deterioration of the iron loss property and prevents good magnetostriction and good iron loss from being achieved together.

The invention claimed is:
1. A method for manufacturing a grain-oriented electrical steel sheet having a forsterite film and a tension-applying insulating coating at both of one surface and an opposite surface thereof, the method comprising:
hot rolling a slab to obtain a hot rolled sheet;
optionally subjecting the hot rolled sheet to hot band annealing;
subsequently subjecting the hot rolled sheet to cold rolling once, or twice or more with intermediate annealing in-between, to obtain a cold rolled sheet of final sheet thickness;
subsequently subjecting the cold rolled sheet to decarburization annealing to obtain a decarburization annealed sheet;
subsequently applying an annealing separator having MgO as a main component onto both of one surface and an opposite surface of the decarburization annealed sheet and then subjecting the decarburization annealed sheet to final annealing to form the forsterite film and obtain a final annealed sheet; and
subsequently applying an insulating coating treatment liquid onto both of one surface and an opposite surface of the final annealed sheet and then subjecting the final annealed sheet to flattening annealing that also serves as baking to form a tension-applying insulating coating on both of the one surface and the opposite surface of the final annealed sheet to obtain the grain-oriented electrical steel sheet, wherein in formation of the forsterite film and the tension-applying insulating coating in both of the one surface and the opposite surface of the sheet, an absolute value of a difference between total tension of the forsterite film and the tension-applying insulating coating in the one surface of the sheet and total tension of the forsterite film and the tension-applying insulating coating in the opposite surface of the sheet is adjusted to less than 0.5 MPa, an absolute value of a difference between tension of the forsterite film in the one surface of the sheet and tension of the forsterite film in the opposite surface of the sheet is adjusted to 0.5 MPa or more, and an absolute value of a difference between tension of the tension-applying insulating coating in the one surface of the sheet and tension of the tension-applying insulating coating in the opposite surface of the sheet is more than 0 MPa.

2. The method for manufacturing a grain-oriented electrical steel sheet according to claim 1, wherein
tension of the forsterite film is adjusted through at least one of: changing formation conditions of an internal oxidation layer at front and rear steel sheet surfaces in the decarburization annealing; changing the annealing separator in terms of type; changing the annealing separator in terms of application amount; and changing an amount of electrodeposition in electrodeposition treatment performed before the final annealing.

3. The method for manufacturing a grain-oriented electrical steel sheet according to claim 1, wherein
tension of the tension-applying insulating coating is adjusted through at least one of: changing the tension-applying insulating coating in terms of thickness; and changing the tension-applying insulating coating in terms of composition.

4. The method for manufacturing a grain-oriented electrical steel sheet according to claim 2, wherein
tension of the tension-applying insulating coating is adjusted through at least one of: changing the tension-applying insulating coating in terms of thickness; and changing the tension-applying insulating coating in terms of composition.

* * * * *